United States Patent [19]

Schuster et al.

[11] Patent Number: 4,796,999
[45] Date of Patent: Jan. 10, 1989

[54] DEVICE FOR AUTOMATICALLY DETERMINING THE DEVIATION BETWEEN THE STRUCTURES OF A PATTERN AND THOSE OF AN OBJECT COMPARED THEREWITH

[75] Inventors: Erich Schuster, Huettenberg; Manfred Kartzow, Wetzlar, both of Fed. Rep. of Germany

[73] Assignee: Ernst Leitz Wetzlar GmbH, Wetzler, Fed. Rep. of Germany

[21] Appl. No.: 25,144
[22] PCT Filed: Apr. 10, 1986
[86] PCT No.: PCT/DE86/00157
  § 371 Date: Jan. 16, 1987
  § 102(e) Date: Jan. 16, 1987
[87] PCT Pub. No.: WO86/07169
  PCT Pub. Date: Dec. 4, 1986

[30] Foreign Application Priority Data

May 20, 1985 [DE] Fed. Rep. of Germany ....... 3518043

[51] Int. Cl.⁴ .............................................. G01B 11/00
[52] U.S. Cl. .................................................... 356/394
[58] Field of Search ................ 356/388, 394; 250/235

[56] References Cited

U.S. PATENT DOCUMENTS 3,234,844  2/1966  Fain et al. ........................... 250/235
3,865,483  2/1975  Wojcik ................................... 355/43
3,909,602  9/1975  Micka ................................... 356/394
4,165,149  8/1979  Suzuki et al. ......................... 350/6.1

FOREIGN PATENT DOCUMENTS 3305014  9/1983  Fed. Rep. of Germany .

Primary Examiner—F. L. Evans
Attorney, Agent, or Firm—Foley & Lardner, Schwartz, Jeffery, Schwaab, Mack, Blumenthal & Evans

[57] ABSTRACT

In a device for automatically determining the deviation between the structures of a pattern and those of a reference object, the structures to be compared are imaged, in a superposed condition, on a measurement gap, a polarization characteristic being imparted to the individual image channels. By relative movement between the superposed object image and the measurement gap and the subsequent separation of the image channels in dependence upon their polarization characteristic, photometric signal curves are obtained, from which errors in the superposition of the structures are quantitatively determined. A measurement in two coordinate directions is possible by insertion of an image-rotating prism. In an observation beam path which is branched off, the polarization characteristic is converted into a color characteristic, so that an additional double-image presentation of the structure superposition is produced. The photometric scanning range can be made visible by back-illumination of the measurement gap and reflection into the observation beam path.

11 Claims, 1 Drawing Sheet

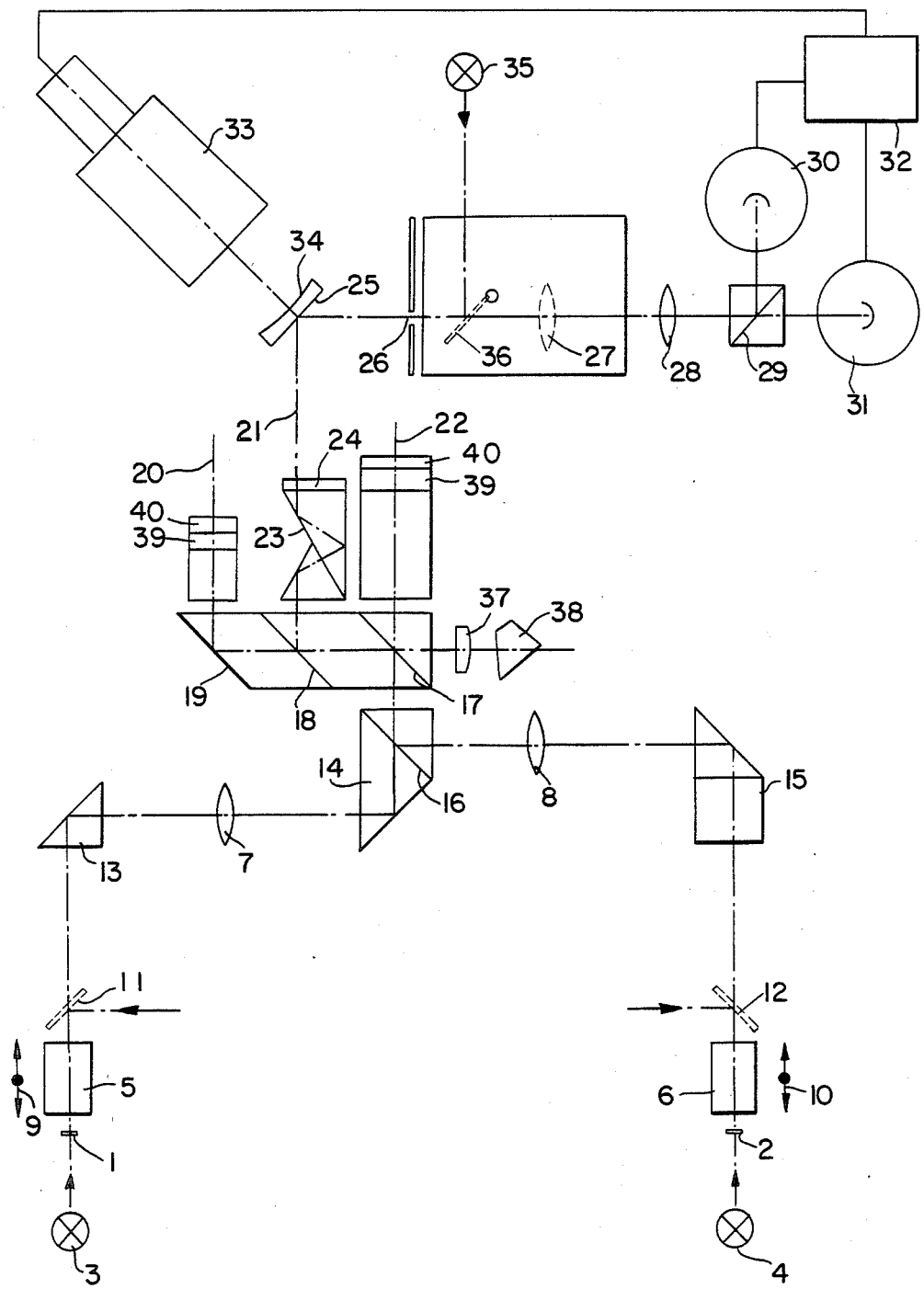

DEVICE FOR AUTOMATICALLY DETERMINING THE DEVIATION BETWEEN THE STRUCTURES OF A PATTERN AND THOSE OF AN OBJECT COMPARED THEREWITH

BACKGROUND OF THE INVENTION

The invention relates to a device for automatically determining the deviation between the structures of a pattern and those of a reference object.

The structures to be investigated with respect to their mutual deviation may be present, for example, on the masks which are customary in semiconductor production or also on the wafers produced by exposure processes. However, other microstructures can also be involved, which are applied to workpieces for the examination of their accuracy to gauge.

The requirements imposed by the semiconductor industry on the accuracy of the measuring devices for research, development and production control increase to the extent that the masks and wafers become larger and their structures smaller. The important matter is to supervise the production process and to correct that process in due time, in order to achieve an optimal output.

An economic process for the monitoring of the accuracy to gauge of masks and wafers from the current production is their comparison with a master mask. The mask comparison devices (e.g. LEITZ list item no. 810–109) developed for this purpose permit a visual observation of superposition errors between the structures and a visually monitored measurement of the superposition errors. By means of micrometer screws, the structures to be compared are displaced relative to one another until such time as their edges are disposed one above the other. This process is costly in terms of time, and is not free from subjective error effects caused by the person carrying out the measurement.

From German Offenlegungsschrift No. 3,305,014, an arrangement is known, by means of which superposition errors can be determined automatically by a photometric measurement. As in the case of the visually monitored mask comparison devices, the structures to be compared are illuminated in complementary colors and are imaged when superposed. The superposed image of the structures is transferred into the plane of a measurement gap and moved relative to the latter. The energy of the light passing through the measurement gap is broken down into light-energy components of each respective one of the complementary colors, corresponding to the differing wavelengths. A signal curve is generated in each instance from the light-energy components, as a function of the travel coordinates of the image relative to the measurement gap. The edge location of the structures to be compared with one another is determined from these signal curves in accordance with processes, known per se, of photometry for the determination of structure widths, and the superposition error of the two structures relative to one another is computed therefrom by difference formation. This automatically operating measurement arrangement requires the generation of two separate image channels, which are distinguishable by complementary color recognition.

While wavelength-dependent imaging differences in the two image channels can in part be disregarded in the visual observation of the mixed image, because of the limited spectral sensitivity and the resolving power of the eye, they are extremely important for the purposes of a photometric measurement, which is also intended to provide an increase in the accuracy of measurement. For the purposes of a separation, according to measurement technique, of the two image channels, the optical imaging systems must in the first instance be optimally corrected for the colors to be transmitted by them. However, this can be achieved only in the part of the imaging beam path in which the image channels extend separately. Accordingly, in the part of the imaging beam path in which the two image channels are transmitted while superposed it is necessary to find a compromise with regard to the chromatic correction. This is the more successful, the smaller is the wavelength difference of the two complementary colors. Thus, there is however, in turn, a difficulty on account of the color filters to be employed for the color separation. These have only a limited characteristic gradient, so that there is a certain spectral overlap region. For the purposes of the photometric measurement, this means cross-talk from one of the image channels into the other.

Additional difficulties arise as a result of the differing spectral sensitivity of the receivers, which leads to a non-uniform signal-to-noise ratio in the two measurement channels. This renders the subsequent signal processing more difficult.

A further serious disadvantage of the color recognition of the image channels is due to light-energy considerations, since the limitation of bandwidth necessarily restricts the utilized spectral range of the light source. The better is the color splitting generated by the cut-on filters, the greater are the light losses, which cannot be used for the measurement. In the case of rapid scanning of the structures, the light intensities remaining for the individual spectral regions are no longer sufficient to obtain a good signal-to-noise ratio. However, an increase in the total light intensity leads, in some cases, to local heating of the objects, which may lead to destruction of the structures.

The contrast ratios determined by the object are particularly critical for the purposes of a color characteristic. Differing coloration of the structures, coating layers, mask materials, wafer layers etc. lead to differing color contrasts within the individual image channels and also in comparison of the two image channels with one another.

Since, in the case of an automatic measurement, a facility for visual observation of the respective measurement region must also in all cases be possible, there are, in practice, additional restrictions with regard to the optimization of the individual effective parameters. Accordingly, the complementary colors red and green are usually selected for the color characteristic.

SUMMARY OF THE INVENTION

The object of the invention was accordingly to design a device for automatically determining the structure deviations in such a manner that it avoids the disadvantages associated with a color characteristic, and thus in particular permits an optimal utilization of the energy of the light source, creates the same imaging and photoelectric measurement conditions in the two image channels over the entire imaging path and permits a good separation of the image channels without light losses and the contrast properties of which are not disturbed by wavelength-selective properties of the objects. In addition to this, a visually perceptible complementary color representation of the structures should be produced, which has no effect on the photometric beam path, and moreover a visual examination of the photometric scanning region should be permitted. Furthermore, the device should permit a measurement in two coordinate directions, without the necessity to rotate the objects.

The essential concept of the invention resides in the introduction of a polarization characteristic of the image channels, in place of the color characteristic. In this manner, it becomes possible to illuminate both image channels with light of the same spectral composition, so that any chromatic aberrations which may possibly be present act in a similar manner on both image channels. After splitting of the two image channels, a radiation of the same spectral composition is also supplied to the photoelectric receivers, so that receivers with the same spectral sensitivity can be selected. The direct optical coupling between the image-deflecting oscillating mirror and a position measuring system permits a very accurate determination of the relative position between object image and measurement gap.

An optimal utilization of the light intensity present in the individual image channels is achieved if the polarization characteristic is introduced at the location of the combination of the image channels. Following the combinacion of the two image channels it is possible, by the insertion of a plurality of neutral divider surfaces, to produce a plurality of beam outputs, which can be employed for various representation purposes. In particular, it is possible to insert into the measurement beam path a prism known per se, which is intended for image rotation and by means of which a measurement according to two coordinate directions is made possible in a simple manner. Since, on rotation of the prism, the polarization vectors of the two image channels are no longer disposed perpendicular and parallel to the reflecting surfaces respectively, an elliptical polarization is created, which can, however, be compensated again by a phase plate, which is fitted at tne exit of the rotation prism and which is provided with an appropriate phase shift.

It is possible to insert, in the beam outputs for the visual display, phase plates which generate a constant phase shift between the two polarization directions of the image channels. In cooperation with polarizing filters positioned downstream, interference effects which are known per se then give rise to complementary colors associated with the image channels. The color representation is dependent exclusively upon the phase shift introduced, and, in particular, has no effect whatsoever on the measurement beam path.

An advantageous supplement to the device is obtained by the back-illumiation of the measurement gap. If the measurement gap is reflected via a triple prism into the beam path for visual observation, then the gap moves relative to the stationary structure. In this manner, the scanned measurement range can be monitored and possibly corrected by manual intervention.

An exemplary embodiment of the invention is described below, with reference to the schematic representation in the drawing.

DETAILED DESCRIPTION OF THE PREFERRED EMBODIMENTS

A mask 1 with specified structure elements or measurement marks and a mask copy 2 are disposed on an object stage, which is not shown in any greater detail and which is displaceable in the x direction and in the y direction. The mask and its copy are illuminated by light sources 3 and 4. The light sources emit white light. It is, of course, also poss ble to employ a single light source in place of two light sources and to direct its radiation onto the two objects by means of deflecting mirrors. The imaging of the objects takes place by means of objectives 5 and 6, as well as by tubular optical systems 7 and 8 which may possibly be necessary. The objectives 5 and 6 are connected to an autofocus device indicated by the arrows 9 and 10. In place of the transmitted light illumination shown, it is also possible, by means of the divider mirrors 11 and 12, for reflected light illumination to take place.

By means of deflecting prisms 13, 14, 15, the two image channels are combined at the polarizing divider mirror 16. Both the glass paths and also the air paths in the two image channels up to combination at the divider mirror 16 are selected in such a manner that they correspond. The rays passing through the polarizing divider mirror 16 and the rays reflected at it are linearly polarized perpendicular to one another. The two image channels have thus received an identifying characteristic.

Downstream, there are inserted into the superposed beam path two neutral divider mirrors 17, 18 and a totally reflecting mirror surface 19, by means of which three beam outputs 20, 21, 22 are created. The output 21 is the measurement beam path. The output 20 can be employed, for example, for a television representation, and the output 22 for visual observation through an eyepiece or in a projection on a ground glass plate.

An Abbé-König prism 23 for image rotation is inserted into the measurement beam patn 21. At the beam output side of the prism, a phase plate 24 is fixedly connected to the prism 23. This may comprise, for example, a thin quartz plate, the optical axes of which are oriented, in the normal setting of the prism 23, parallel to the polarization vectors of the two image channels. Since a rotation of the prism 23 by 45° is necessary in order to generate an image rotation of 90°, the reflecting surfaces of the prism in this position are no longer parallel and perpendicular to the polarization vectors of the two image channels respectively. Accordingly, both polarization vectors receive a phase shift, which, as has become evident in practice, corresponds to approximately $\lambda-4$. The linear polarization has accordingly been converted approximately into a circular polarization. The phase plate 24, which is also rotated, is selected in such a manner that it cancels out the phase shift in the two image channels. In the continuation of the beam path, the two image channels then again have their original direction of polarization.

The measurement beam path 21 is then conducted via an oscillating mirror 25 to a measurement gap 26. The optical imaging system of the two image channels is coordinated in such a manner that a superposed image of the mask 1 and of the mask copy 2 is formed in the gap plane 26. By means of the lenses 27, 28, the measurement gap 26 is then imaged via an analyzer 29 (polarizing divider mirror) on photoelectric detectors 30, 31. The analyzer 29 separates the measurement beam path according to the polarization directions associated with the two image channels.

For the performance of the measurement, the mirror 25 oscillates about an axis which stands perpendicular to the plane of the drawing, so that the superposed image of the two structures is moved along periodically over the measurement gap 26. The electrical signal curves generated in the course of this procedure by the photoelectric detectors 30, 31 are passed to a processing circuit 32.

A photoelectric path-measuring or angle-measuring device 33 which is known per se is coupled to the oscillating mirror 25. The coupling takes place in that the rear surface 34 of the oscillating mirror 25 is connected, in reflection, to the optical beam path of the measuring system 33. The signals of the measuring device 33 which correspond to the respective position of the oscillating mirror 25 are likewise passed to the processing circuit 32. A suitable path-measuring system 33 with a drive unit for the oscillating mirror 25 is described, for example, in patent application P No. 35 17 070.0 (our file reference A 2224/B 3972, received at the Patent Office on 11.05.85).

The processing circuit 32 determines, from the signal curves associated with the image channels, respective values for the position of the edge of the measured structure. Difference formation gives the magnitude of the deviation between the superposed structures in one coordinate direction.

For the examination of the scanned object region, back-illumination of the measurement gap 26 by means of a pilot illumination 35 and a mirror 36 which can be swung into the measurement beam path is possible. The gap illumination is reflected, via the oscillating mirror 25, the rotating prism 23, the divider mirror 18, an auxiliary optical system 37 and a triple prism 38, after reflection at the divider mirror 17, for example, into the visual observation beam path 22. While the object image moves over the measurement gap in the measurement beam path, there is in the eyepiece observation a movement of the measurement gap over the stationary object image. Since, on rotation of the prism 23, the gap image is likewise rotated, the scanning of the object region in both coordinate directions can be examined.

In order to generate a complementary color presentation, respective combinations of phase plate 39 and polarizing filter 40 are inserted into the beam paths 20 and 22. The mode of action by which this combination of components generates a color representation from a beam path with components which are linearly polarized perpendicular to one another is known per se. The polarization vectors of the filter 40 must be oriented parallel to the polarization directions of the polarizing divider mirror 16. If, for example with the aid of the phase plate 39, for an average wavelength $\lambda - = 550$ nm from $2\lambda -$ is then introduced, then, as a result of interferences, a red representation is obtained for one of the image channels and a green representation for the other image channel. Other combinations of complementary colors can also be selected by the selection of different phase shifts.

We claim:

1. A device for automatically comparing and determining the deviation between at least two structures, said device comprising:
    means for generating an image of each structure to be compared and for guiding the image of each structure along a respective beam path,
    means for providing the image of each structure with an identifying polarization characteristic,
    means for combining the respective imaging beam paths into a common imaging beam path,
    means for coupling out at least one of a visual and television observation beam path from the combined beam path, the coupling means including a face plate with associated polarizing filters inserted in the visual and/or television beam path in order to generate a color representation of the image of each of the structures which corresponds to their respective identifying polarization characteristic,
    means for imaging the image of each structure to be compared on a measuring gap to form a superimposed image of the structures on the measuring gap,
    means for providing relative movement between the superimposed image of the structures and the measuring gap,
    means for splitting radiation passing through the measurement gap into radiation components corresponding to the identifying polarization characteristic of the image of each structure, and imaging the radiation components onto photoelectric detectors,
    means for producing signal curves as a function of the relative position of the superimposed image and a measurement gap,
    means for evaluating the signal curves with reference to a mutual displacement.

2. The device as claimed in claim 1, wherein said means for providing the image of each structure with an identifying polarization characteristic comprises linearly polarized filters which are cross relative to one another and inserted in the respective imaging beam paths for the image of each structure, and said means for splitting comprises polarizing filters which are cross relative to one another and located in front oftthe photoelectric detectors.

3. The device as claimed in claim 1, wherein said means for providing the image of each structure with an identifying polarization characteristic and said means for splitting comprise linearly polarizing divider mirrors.

4. The device as claimed in claim 1, wherein the means for providing relative movement comprises a plane oscillating mirror coupled to a phtoelectric path-measuring or angle-measuring system that is provided to measure the position of the plane oscillating mirror.

5. The device as claimed in claim 4, wherein the plane oscillating mirror carries on its rear surface a mirror surface, which cooperates with an imaging system associated with the path-measuring or angle-measuring system.

6. The device as claimed in claim 4, wherein a prism for image rotation is disposed in front of the oscillating mirro in the common imaging beam path.

7. The device as claimed in claim 6, wherein an Abbe-Konig prism is provided as the prism for image rotation.

8. The device as claimed in claim 6 wherein a phase plate for the compensation of the elliptical polarization created by reflection at the prism surfaces is disposed behind the prism.

9. The device as claimed in claim 1, wherein behind the measurement gap there is disposed a pivotable mirror, by means of which the measurement gap is illuminated against the direction of the imaging beams for the structures to be compared, the gap illumination beams being conducted via an oscillating mirror a neutral divider mirrors disposed behind a beam-combining divider mirror and a triple prism to the visual and/or television observation beam path.

10. The device as claimed in claim 3, wherein, in order to generate the relative movement between image and measurement gap, a plane oscillating mirror coupled to a photoelectric patch-measuring or angle-measuring system is provided.

11. The device as claimed in claim 7, wherein a phase plate for the compensation of the elliptical polarization created by reflection at the prism surfaces is disposed behind the prism.

* * * * *